United States Patent
Toshida et al.

[11] Patent Number: 6,017,644
[45] Date of Patent: Jan. 25, 2000

[54] ORGANIC COMPOUND, ITS POLYMER AND LIGHT EMITTING DEVICE

[75] Inventors: Yomishi Toshida, Yokohama; Akihiro Senoo, Tokyo; Kazunori Ueno, Ebina; Seiji Mashimo, Tokyo, all of Japan

[73] Assignee: Canon Kabushiki Kaisha, Tokyo, Japan

[21] Appl. No.: 09/152,074

[22] Filed: Sep. 11, 1998

[30] Foreign Application Priority Data

Sep. 16, 1997 [JP] Japan ................................. 9-268234

[51] Int. Cl.$^7$ .................................................. H05B 33/14
[52] U.S. Cl. .......................... 428/690; 428/691; 428/917; 313/504; 528/366; 528/507; 528/425; 528/422
[58] Field of Search .................................. 422/690, 691, 422/917; 313/504; 528/366, 507, 422, 425

[56] References Cited

U.S. PATENT DOCUMENTS

| | | | |
|---|---|---|---|
| 3,172,862 | 3/1965 | Gurnee | 252/301.3 |
| 3,173,050 | 3/1965 | Gurnee | 313/108 |
| 4,356,429 | 10/1982 | Tang | 313/503 |
| 4,539,507 | 9/1985 | VanSlyke et al. | 313/504 |
| 4,720,432 | 1/1988 | VanSlyke et al. | 428/457 |
| 5,807,974 | 9/1998 | Kim et al. | 528/366 |
| 5,876,864 | 3/1999 | Kim et al. | 428/690 |
| 5,900,327 | 5/1999 | Pei et al. | 428/690 |

FOREIGN PATENT DOCUMENTS

| | | |
|---|---|---|
| 194393 | 11/1984 | Japan . |
| 264692 | 11/1988 | Japan . |
| 163188 | 7/1991 | Japan . |

OTHER PUBLICATIONS

Pope, et al.; "Electroluminescence in Organic Crystals"; J. Chem. Phys. 38, 2042–2043 (1963).

Helfrich, et al.; Transients . . . in Anthracene; J. Chem. Phys. 44 2902–2909 (1966).

Schwob, et al.; "Charge Transfer . . . antracene crystals"; J. Chem. Phys., 58, 4 (1973) 1542–1547.

(List continued on next page.)

*Primary Examiner*—Charles Nold
*Attorney, Agent, or Firm*—Fitzpatrick, Cella, Harper & Scinto

[57] ABSTRACT

A light emitting device is composed of a pair of electrodes and an organic compound layer interposed between the electrodes. In the organic compound layer is used a organic compound shown by the following formula (1):

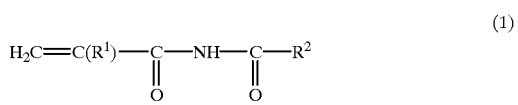

wherein $R^1$ is a hydrogen atom, an alkyl group or a halogen atom, $R^2$ is X—$Ar^1$; X is NH, O or S, $Ar^1$ is a substituted or unsubstituted aromatic ring having a partial structure shown by the following formula (2):

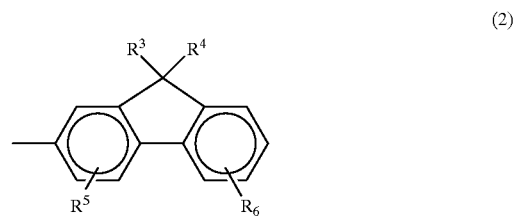

or a substituted or unsubstituted heterocyclic ring; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring.

12 Claims, 2 Drawing Sheets

OTHER PUBLICATIONS

Helfrich, et al.; "Recombination . . . Antracene Crystals"; Phys. Rev. Lettrs., 14, 7 (1965) 229–231.

Partridge; "Electroluminescence . . . devices"; Polymer, 24, 6 (1983) 748–754.

Kalinowski, et al.; "Magnetic Field . . . Tetracene Crystal"; Chem. Phys. Ltrs., 36, 3 (1975) 345–348.

Hayashi, et al.; "Electroluminescence of Perylene Films . . . Anode"; J. Jour. Appl. Phys., 25, 9 (1986) L773–L775.

Vincett, et al.; "Electrical Conduction . . . Organic Films"; Thin Solid Films, 94 (1982) 171–183.

Tang, et al.; "Organic Electroluminescent Diodes"; Appln. Phys. Lett. 51, 12 (1987) 913–915.

Moon, et al.; "High–density . . . melt processing"; Appl. Phys. Lett. 55, 14 (1989) 1466–1468.

Proc. $50^{th}$ Acad. Lect. of Japan Soc. of Appl. Phys. p. 1006 (1989) 29p–ZP–5 to 29p–ZP–7. No Translation.

Proc. $51^{th}$ Acad. Lect. of Japan Soc. of Appl. Phys. p. 1041 (1990) 28a–PB–8. No Translation.

Proc. $38^{th}$ Appl. Phys. Asso. Lecture, p. 1086 (1991) 31p–G–13, 31p–G–14. No Translation.

ORGANIC COMPOUND, ITS POLYMER AND LIGHT EMITTING DEVICE

BACKGROUND OF THE INVENTION

1. Field of the Invention

The present invention relates to a novel organic compound and its polymers. It further relates to a light emitting device which has a light emitting layer composed of a light emitting material and transfers the energy of applied voltage directly to light energy.

2. Description of the Related Art

Electroluminescence (EL) of organic materials was observed in anthracene single crystals by Pope et al. in 1963 (J. Chem. Phys. 38 2042). With the use of a solution electrode system having a high injection efficiency, comparatively strong injection type electroluminescence was successfully observed by Helfinch and Schneider in 1965 (Phys. Rev. Lett. 14 229).

Since then studies have been made on organic light emitting substances each composed of a conjugated organic host emitting material and a conjugated organic activator having a condensed benzene ring, as reported in, for example, U.S. Pat. No. 3,172,862, No. 3,173,050, J. Chem. Phys. 44(1966)2902, J. Chem. Phys. 50(1969)14364, J. Chem. Phys. 58(1973)1542 or Chem. Phys. Lett. 36(1975) 345. Each of these organic light emitting substances is, however, a single layer having a thickness of more than 1 µm and requires a high electric field for light emission. Accordingly, attempts have been made to develop thin film devices obtained by vacuum deposition (e.g., Thin solid Films 94(1982)171, Polymer 24(1983)748, J. Appl. Phys. 25(1986)L773). While such thin film devices were effective for reducing the drive voltage, they had not yet achieved a sufficiently high luminance for practical use.

Recently, Tangs et al. (Appl. Phys. Lett. 51(1987)913; and U.S. Pat. No. 4,356,429) invented an electroluminescent device obtained by laminating two extremely thin layers (a charge transport layer and a light emitting layer) between an anode and a cathode so as to achieve a high luminance with a low drive voltage. Such laminated organic electroluminescent devices have been thoroughly studied thereafter as reported, for instance, in Japanese Patent Laid-Open No. 59-194393, U.S. Pat. No. 4,539,507, U.S. Pat. No. 4,720,432, Japanese Patent Laid-Open No. 63-264692, Appl. Phys. Lett. 55(1989)1467 and Japanese Patent Laid-Open No. 3-163188.

Laminated organic electroluminescent devices are usually obtained by vacuum deposition, whereas devices having a relatively high luminance have been reported to be obtained by casting (Proceedings of the 50th Academic Lecture of The Japan Society of Applied Physics, 1006(1989); and Proceedings of the 51st Academic Lecture of The Japan Society of Applied Physics, 1041(1990)).

It has been also reported that electroluminescent devices having a mixed one-layer structure are obtained by dip coating with a solution containing a mixture of polyvinyl carbazole as a hole transport compound, an oxadiazole derivative as an electron transport compound and coumarin 6 as an illuminant. These devices provide a relatively high luminous efficiency (Proceedings, of the 38th Applied Physics-related Association Lecture, 1086(1991)).

As described above, great advantages have been made recently in organic electroluminescent devices, indicating that they can be applied to a broad spectrum of applications.

The studies on these electroluminescent devices, however, have been conducted too recently to give sufficient results on selection of materials or production methods of devices. Light emission with a further high luminance or having a wide variety of emission wavelengths have not yet been sufficiently achieved. In addition, these electroluminescent devices are still insufficient in light emission properties, and especially luminous efficiency. Therefore, there is a desire to further improve and investigate such devices.

SUMMARY OF THE INVENTION

Under these circumstances, the present inventors have conducted intense studies. It is, therefore, an object of the present invention to provide a novel and useful organic compound providing a light emission with a high luminance, a polymer of a polymerizable organic compound providing a light emission with a high luminance and a light emitting device using the same.

To be more specific, the present invention provides, in one aspect, an organic compound shown by the following formula (1):

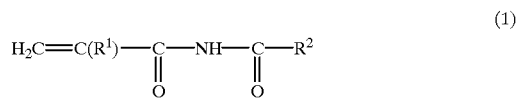
(1)

wherein $R^1$ is a hydrogen atom, an alkyl group or a halogen atom, and $R^2$ is $X-Ar^1$; X is NH, O or S, and $Ar^1$ is a substituted or unsubstituted aromatic ring having a partial structure represented by formula (2):

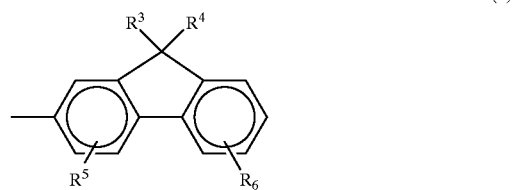
(2)

or a substituted or unsubstituted heterocyclic ring; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring The present invention provides, in another aspect, a polymer shown by the following formula (11):

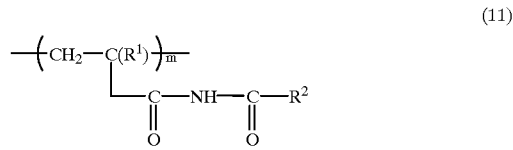
(11)

wherein $R^1$ is a hydrogen atom, an alkyl group or a halogen atom, and $R^2$ is $X-Ar^1$; X is NH, O or S, and $Ar^1$ is a substituted or unsubstituted aromatic ring having a partial structure (2) shown below:

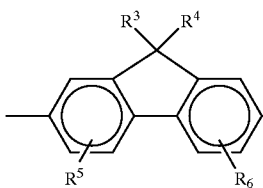

(2)

or a substituted or unsubstituted heterocyclic ring; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring; and m denotes an integer of from 2 to 3,000.

In yet another aspect the present invention provides a light emitting device composed of a pair of electrodes and an organic compound layer interposed between the electrodes, wherein the aforementioned organic compound shown by the formula (1) is used to form the organic compound layer.

In addition and advantageously, the light emitting device of the present invention includes a light emitting device having an organic compound layer obtained from the aforementioned polymer shown by the formula (11).

According to the present invention, an organic material and polymer suitable as materials for a light emitting device can be provided. When light emitting devices are formed using the organic material or polymer with the advantages of the structure of the compound or the features of the polymeric structure of the polymer, thin films having large areas can be obtained.

In addition, the light emitting device using the organic compound or its polymer of the present invention can emit a luminescence having a markedly high luminance employing a low applied voltage.

DESCRIPTION OF THE PREFERRED EMBODIMENT

Figure 1:
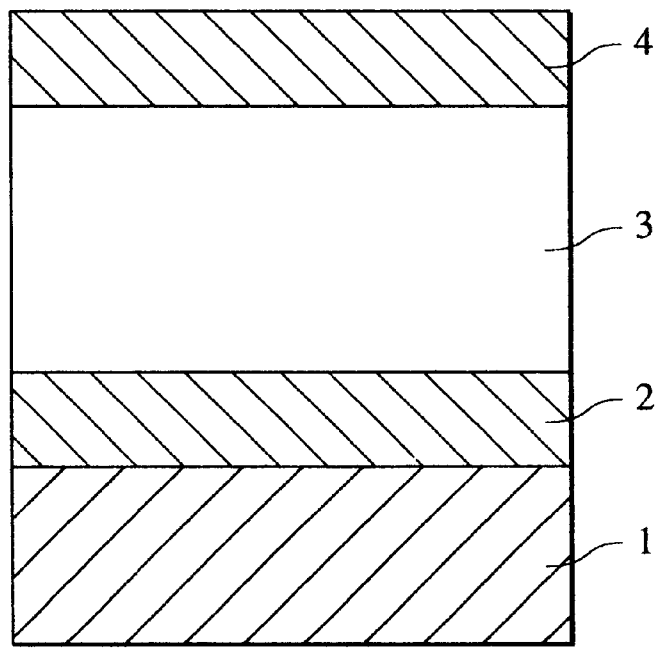
FIG. 1 is a schematic sectional view showing an embodiment of the light emitting device of the present invention.

The present invention provides, in one aspect, a novel organic compound represented by the following formula (1), or its polymer represented by the following formula (11):

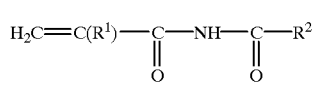

(1)

wherein $R^1$ is a hydrogen atom, an alkyl group or a halogen atom, and $R^2$ is $X$—$Ar^1$; $X$ is NH, O or S, and $Ar^1$ is a substituted or unsubstituted aromatic ring having a partial structure (2) shown below:

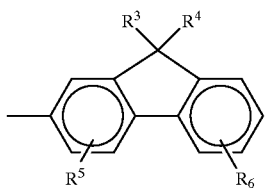

(2)

or a substituted or unsubstituted heterocyclic ring; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring:

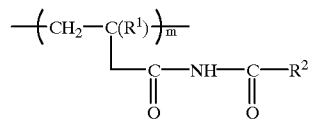

(11)

wherein $R^1$ and $R^2$ have the same meanings as defined above; and m denotes an integer of from 2 to 3,000.

In another aspect the present invention provides a light emitting device composed of a pair of electrodes consisting of an anode and a cathode and an organic compound layer interposed between the electrodes, wherein the organic compound of the following formula (1) or the polymer of the following formula (11) is used to form the organic compound layer:

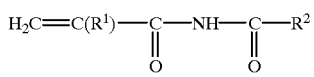

(1)

wherein $R^1$ and $R^2$ have the same meanings as defined above;

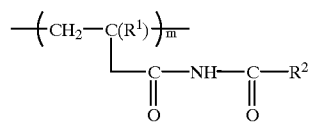

(11)

wherein $R^1$ and $R^2$ have the same meanings as defined above; and m denotes an integer of from 2 to 3,000.

In the organic compound of the formula (1) or the polymer of the formula (11) each according to the present invention, $R^1$ represents a hydrogen atom, an alkyl group or a halogen atom. The alkyl group includes, for example, a straight-chain or branched alkyl group having from 1 to 6 carbon atoms. Examples of the halogen atom include a fluorine atom, a chlorine atom, a bromine atom, an iodine atom and the like.

In the organic compound of the formula (1) or the polymer of the formula (11) each according to the present invention, the substituent $R^2$ is preferably one selected from those having the following structures (3)–(6):

(3)

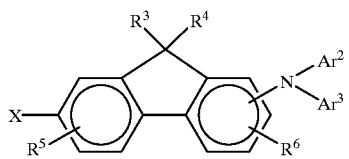

(4)

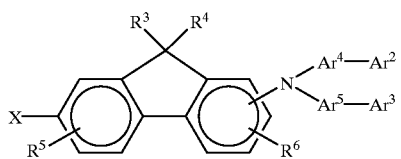

(5)

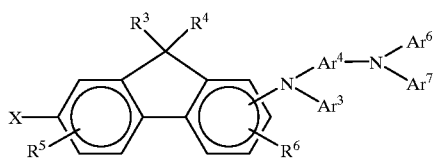

(6)

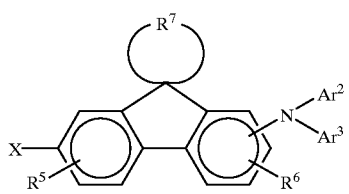

wherein X is NH, O or S; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring; $R^7$ is an alkylene group having from 2 to 10 carbon atoms; and each of $Ar^2$, $Ar^3$, $Ar^4$, $Ar^5$, $Ar^6$ and $Ar^7$ is a substituted or unsubstituted aromatic ring, or a substituted or unsubstituted heterocyclic ring.

The more preferable examples of the substituent $R^2$ include those having the following structures (7)–(10):

(7)

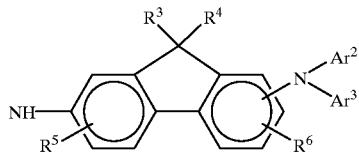

(8)

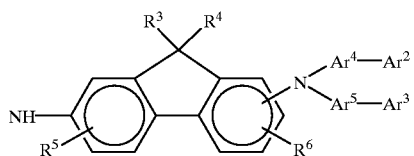

(9)

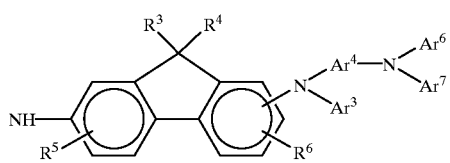

-continued (10)

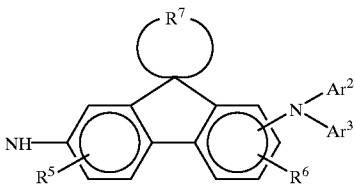

wherein $R^3$ to $R^7$ and $Ar^2$ to $Ar^7$ have the same meanings as defined above.

Next, the practical examples of the substituents $R^3$ to $R^7$ and $Ar^2$ to $Ar^7$ are shown below.

(i)    $R^3$, $R^4$: H,    —$C_nH_{2n+1}$ (n: an integer from 1 to 6)

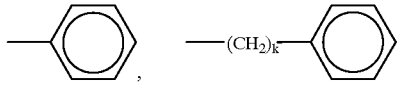

(k: an integer from 1 to 3)

(ii)    $R^5$, $R^6$: H,

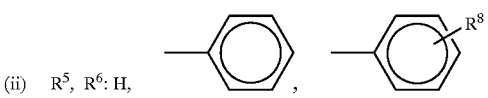

($R^8$: a straight-chain or branched alkyl group having 1 to 6 carbon atoms, a halogen atom, OH)

(iii)    $R^7$:    —$(CH_2)_L$—

(L: an integer from 2 to 10)

(iv)    $Ar^2$, $Ar^3$:

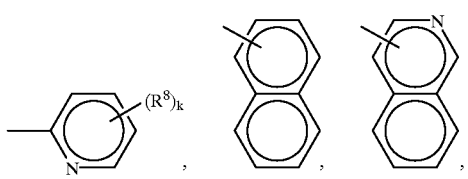

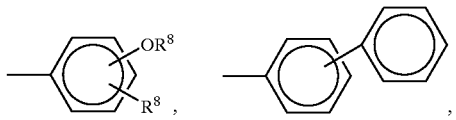

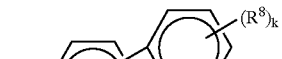

(k: an integer from 1 to 3)

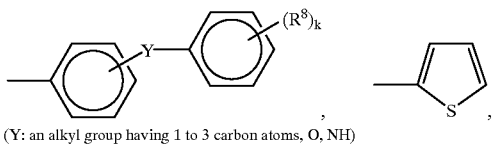

(Y: an alkyl group having 1 to 3 carbon atoms, O, NH)

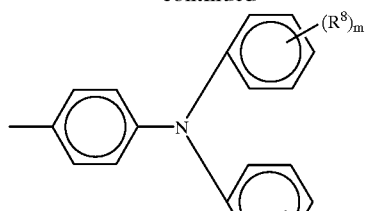
(m, n: 0 or 1)
(v) Ar⁴, Ar⁵:
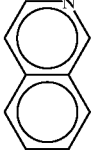
(vi) Ar⁶, Ar⁷: the same as Ar², Ar³
The practical examples of the organic compound shown by the formula (1) of the present invention are shown below, but these examples are not deemed to limit the scope of the invention.
Functional group:
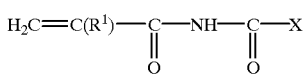
| | Functional group No. |
|---|---|
| 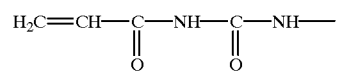 | A |
| 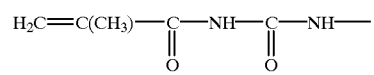 | B |
| 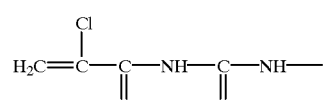 | C |
| 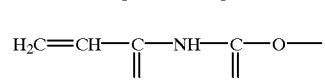 | D |
Functional group:
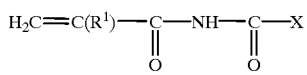
| | Functional group No. |
|---|---|
| 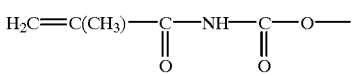 | E |
| 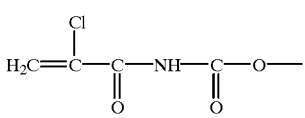 | F |
Functional group: Ar¹
Functional group No.
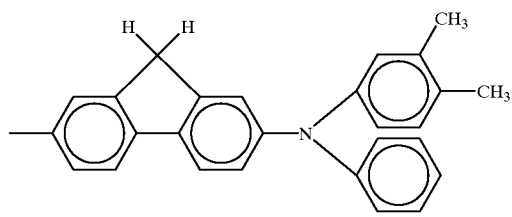
(1)
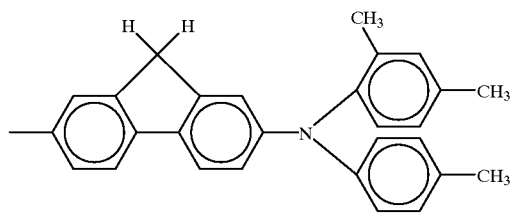
(2)
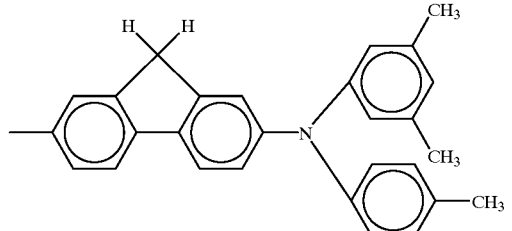
(3)
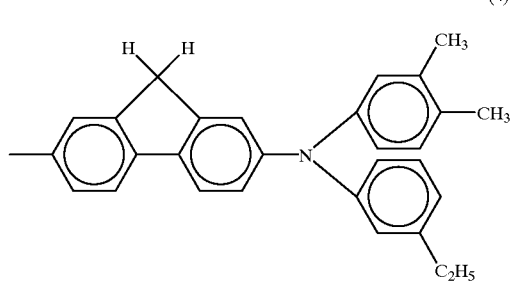
(4)

(5)
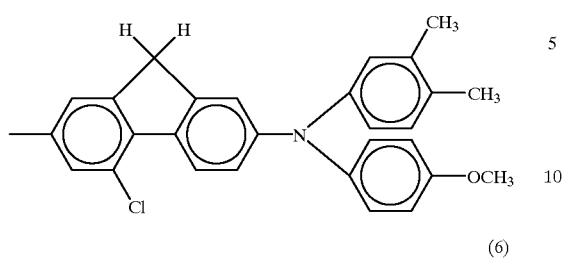
(6)
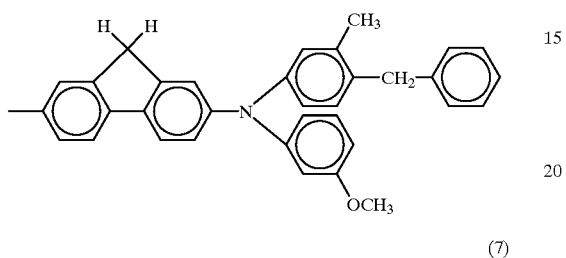
(7)
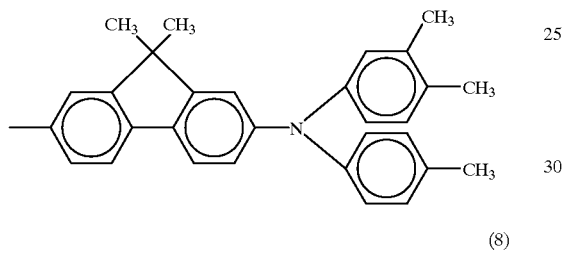
(8)
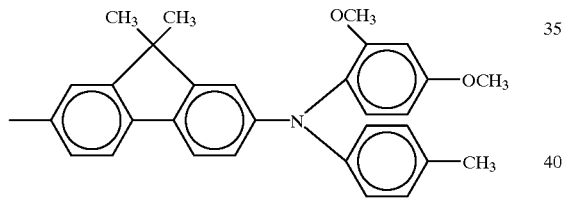
(9)
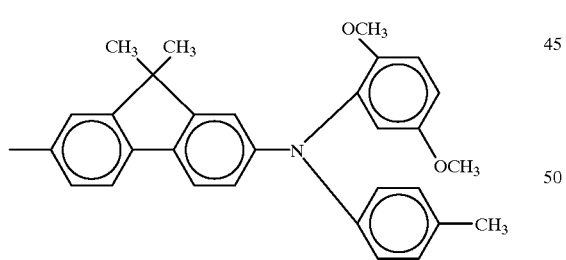
(10)
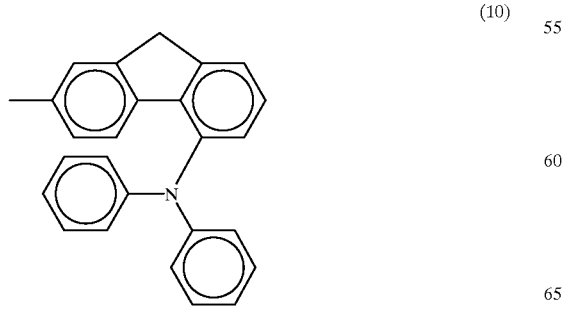
(11)
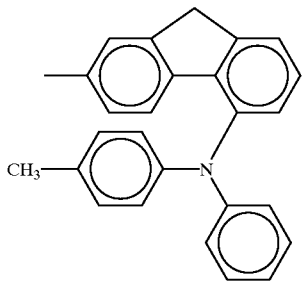
(12)
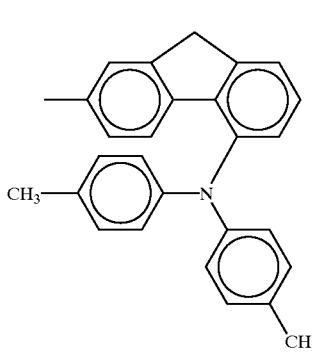
(13)
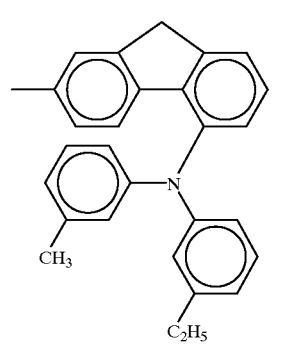
(14)
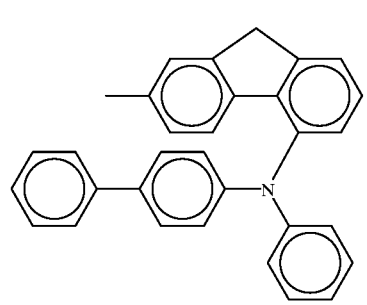
(15)
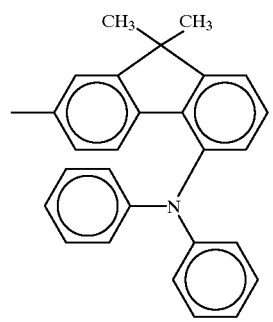

(16)
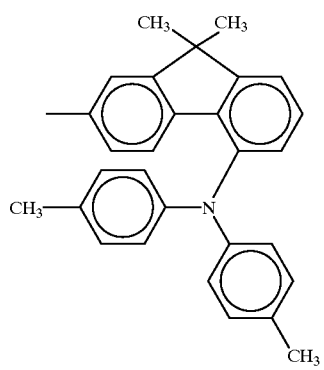
(17)
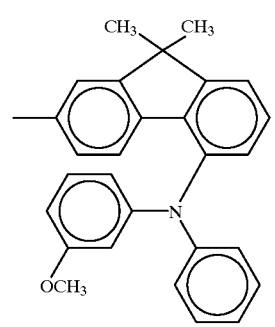
(18)
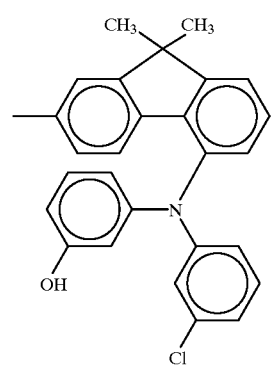
(19)
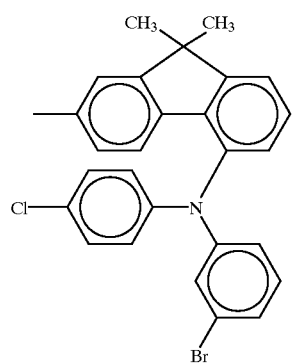
(20)
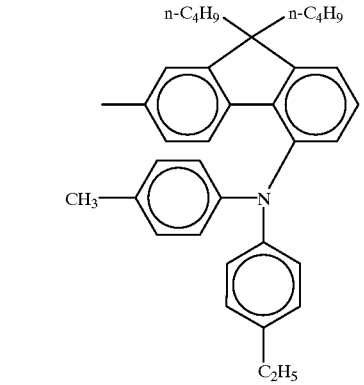
(21)
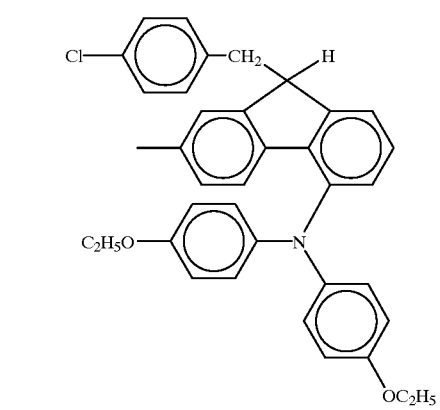
(22)
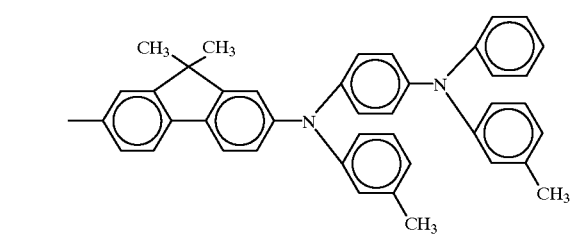
TABLE 1
| Compound No. | Functional group No. | Functional group No. |
|---|---|---|
| A-1 | A | (1) |
| A-2 | A | (2) |
| A-3 | A | (3) |
| A-4 | A | (4) |
| A-5 | A | (5) |
| A-6 | A | (6) |
| A-7 | A | (7) |
| A-8 | A | (8) |
| A-9 | A | (9) |
| A-10 | A | (10) |
| A-11 | A | (11) |
| A-12 | A | (12) |
| A-13 | A | (13) |
| A-14 | A | (14) |
| A-15 | A | (15) |
| A-16 | A | (16) |
| A-17 | A | (17) |
| A-18 | A | (18) |
| A-19 | A | (19) |

TABLE 1-continued

| Compound No. | Functional group No. | Functional group No. |
|---|---|---|
| A-20 | A | (20) |
| A-21 | A | (21) |
| A-22 | A | (22) |

TABLE 2

| Compound No. | Functional group No. | Functional group No. |
|---|---|---|
| B-1 | B | (1) |
| B-2 | B | (2) |
| B-3 | B | (3) |
| B-4 | B | (4) |
| B-5 | B | (5) |
| B-6 | B | (6) |
| B-7 | B | (7) |
| B-8 | B | (8) |
| B-9 | B | (9) |
| B-10 | B | (10) |
| B-11 | B | (11) |
| B-12 | B | (12) |
| B-13 | B | (13) |
| B-14 | B | (14) |
| B-15 | B | (15) |
| B-16 | B | (16) |
| B-17 | B | (17) |
| B-18 | B | (18) |
| B-19 | B | (19) |
| B-20 | B | (20) |
| B-21 | B | (21) |
| B-22 | B | (22) |

TABLE 3

| Compound No. | Functional group No. | Functional group No. |
|---|---|---|
| C-1 | C | (1) |
| C-2 | C | (2) |
| C-3 | C | (3) |
| C-4 | C | (4) |
| C-5 | C | (5) |
| C-6 | C | (6) |
| C-7 | C | (7) |
| C-8 | C | (8) |
| C-9 | C | (9) |
| C-10 | C | (10) |
| C-11 | C | (11) |
| C-12 | C | (12) |
| C-13 | C | (13) |
| C-14 | C | (14) |
| C-15 | C | (15) |
| C-16 | C | (16) |
| C-17 | C | (17) |
| C-18 | C | (18) |
| C-19 | C | (19) |
| C-20 | C | (20) |
| C-21 | C | (21) |
| C-22 | C | (22) |

TABLE 4

| Compound No. | Functional group No. | Functional group No. |
|---|---|---|
| D-1 | D | (1) |
| D-2 | D | (2) |
| D-3 | D | (3) |
| D-4 | D | (4) |
| D-5 | D | (5) |
| D-6 | D | (6) |
| D-7 | D | (7) |
| D-8 | D | (8) |
| D-9 | D | (9) |
| D-10 | D | (10) |
| D-11 | D | (11) |
| D-12 | D | (12) |
| D-13 | D | (13) |
| D-14 | D | (14) |
| D-15 | D | (15) |
| D-16 | D | (16) |
| D-17 | D | (17) |
| D-18 | D | (18) |
| D-19 | D | (19) |
| D-20 | D | (20) |
| D-21 | D | (21) |
| D-22 | D | (22) |

TABLE 5

| Compound No. | Functional group No. | Functional group No. |
|---|---|---|
| E-1 | E | (1) |
| E-2 | E | (2) |
| E-3 | E | (3) |
| E-4 | E | (4) |
| E-5 | E | (5) |
| E-6 | E | (6) |
| E-7 | E | (7) |
| E-8 | E | (8) |
| E-9 | E | (9) |
| E-10 | E | (10) |
| E-11 | E | (11) |
| E-12 | E | (12) |
| E-13 | E | (13) |
| E-14 | E | (14) |
| E-15 | E | (15) |
| E-16 | E | (16) |
| E-17 | E | (17) |
| E-18 | E | (18) |
| E-19 | E | (19) |
| E-20 | E | (20) |
| E-21 | E | (21) |
| E-22 | E | (22) |

TABLE 6

| Compound No. | Functional group No. | Functional group No. |
|---|---|---|
| F-1 | F | (1) |
| F-2 | F | (2) |
| F-3 | F | (3) |
| F-4 | F | (4) |
| F-5 | F | (5) |
| F-6 | F | (6) |
| F-7 | F | (7) |
| F-8 | F | (8) |
| F-9 | F | (9) |
| F-10 | F | (10) |
| F-11 | F | (11) |
| F-12 | F | (12) |
| F-13 | F | (13) |
| F-14 | F | (14) |
| F-15 | F | (15) |
| F-16 | F | (16) |
| F-17 | F | (17) |
| F-18 | F | (18) |
| F-19 | F | (19) |

TABLE 6-continued

| Compound No. | Functional group No. | Functional group No. |
|---|---|---|
| F-20 | F | (20) |
| F-21 | F | (21) |
| F-22 | F | (22) |

The light emitting device of the present invention is composed of a pair of electrodes and an organic compound layer interposed between the electrodes. The organic compound of the formula (1) or the polymer of the formula (11) each used in the organic compound layer has a hole transport property, and they can be used to form the organic compound layer singly or in combination.

The organic compound shown by the formula (1) can be obtained synthetically by the following reaction:

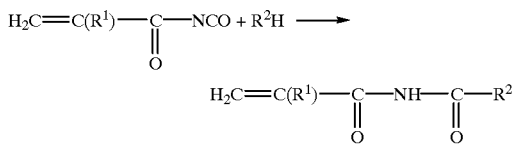

wherein $R^1$ and $R^2$ have the same meanings as defined above.

The polymer of the formula (11) can be obtained, for example, by adding the organic compound of the formula (1) and a polymerization initiator including azo compounds or organic peroxides to a solvent, and heating the resultant mixture in an inert gas; or by heating the organic compound itself or irradiating the same with a ray having activation energy.

The polymerization degree m of the polymer shown by the formula (11) falls in the range from 2 to 3,000, and preferably from 5 to 2,000. The preferable number average molecular weight (Mn) of the polymer is, while it varies depending on the species of the substituents, from 2,000 to $50 \times 10^4$ and more preferably from 3,000 to $20 \times 10^4$. The desirable weight average molecular weight (Mw) of the polymer is, while it varies depending on the species of the substituents, from 2,000 to $100 \times 10^4$ and more preferably from 3,000 to $40 \times 10^4$.

The polymerization degree mentioned above is the value calculated from an average molecular weight, whereas the average molecular weight is calculated, using a calibration curve obtained with the use of a standard sample, from a peak value in a molecular weight distribution measured by gel permeation chromatography (GPC).

The present invention will now be described in more detail with reference to the drawings.

FIG. 1 is a schematic cross-sectional view illustrating an embodiment of the light emitting device of the present invention. The electroluminescent device shown in FIG. 1 is composed of an anode 2, a light emitting layer 3 and a cathode 4 formed in this order on a substrate 1. This organic electroluminescent device is useful for a light emitting device composed of the light emitting layer 3 obtained by mixing three compounds each of which has hole transport property, electron transport property and light emitting property respectively, or by mixing compounds each having two or more of the aforementioned properties (for instance, a compound having both electron transport property and light emitting property, and another compound having hole transport property).

Figure 2:
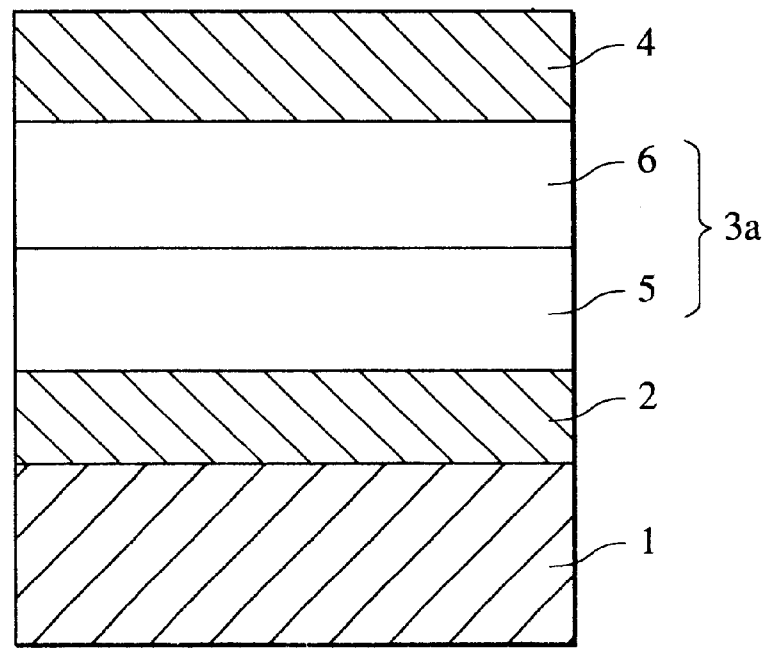
FIG. 2 is a schematic sectional view illustrating another embodiment of the light emitting device of the present invention.

FIG. 2 is a schematic cross-sectional view illustrating another embodiment of the light emitting device of the present invention. The electroluminescent device shown in FIG. 2 is composed of an anode 2, a hole transport layer 5, an electron transport layer 6 and a cathode 4 formed in this order on a substrate 1. A light emitting layer 3a is composed of the hole transport layer 5 and the electron transport layer 6. This embodiment is useful when each of materials having either hole transport property or electron transport property respectively is used in each layer, and either one of the materials has light emitting property. When the light emitting material has hole transport property, it is used in combination with an electron transport material having no light emitting property, and when the light emitting material has electron transport property, it is used in combination with a hole transport material having no light emitting property.

Figure 3:
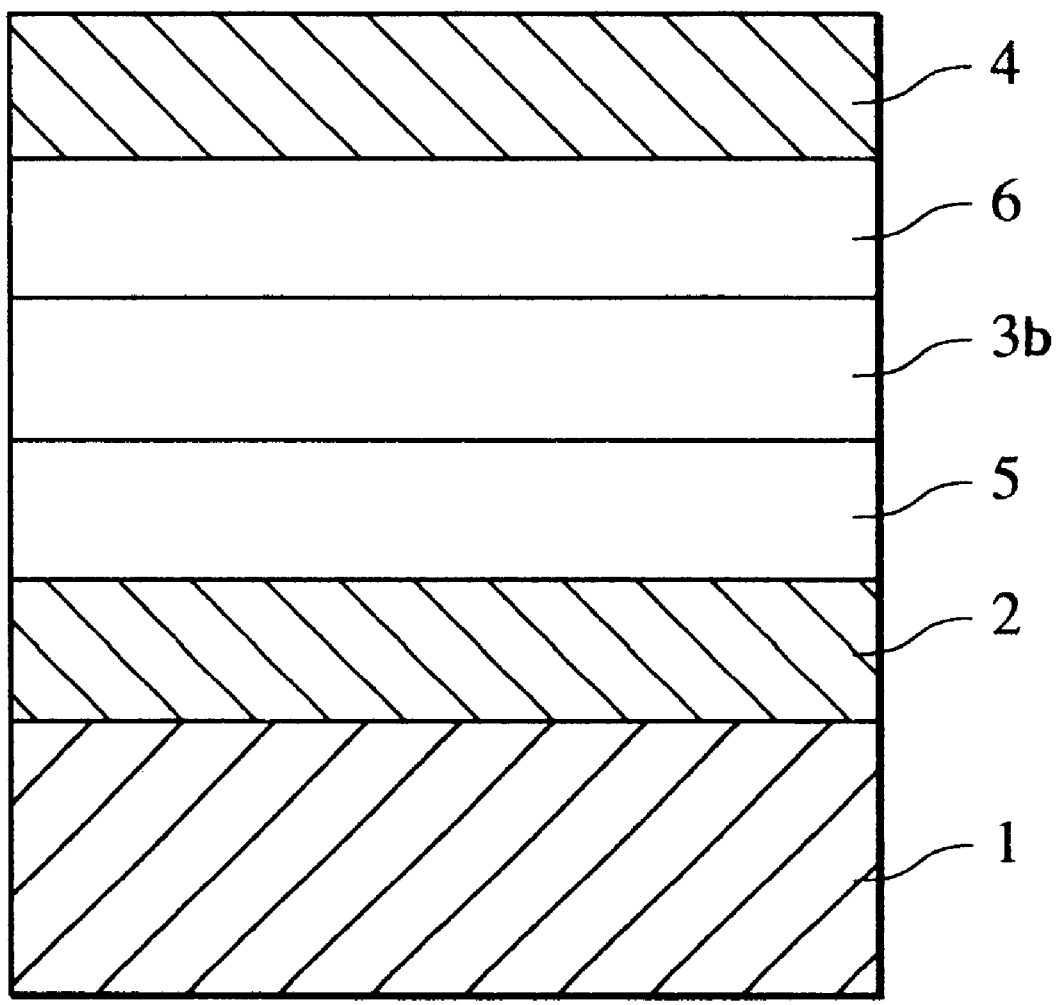
FIG. 3 is a schematic sectional view illustrating yet another embodiment of the light emitting device of the present invention.

FIG. 3 is a schematic cross-sectional view showing a yet further embodiment of the light emitting device of the present invention. The electroluminescent device shown in FIG. 3 is composed of an anode 2, a hole transport layer 5, a light emitting layer 3b, an electron transport layer 6 and a cathode 4 formed in this order on a substrate 1. In this embodiment carrier transport property and light emitting property are shared among different layers, and substances each having hole transport property, electron transport property or light emitting property can respectively be employed in a suitable combination. Accordingly, this embodiment markedly increases the degree of freedom in selection of the materials, whereas luminescent color thereof can be varied since a wide variety of substances having different emission wavelengths can be used. In addition when holes and electrons (or exitons) are effectively enclosed in the central light emitting layer, the luminous efficiency can further be enhanced.

Each of the organic compounds shown by the formula (1) and the polymer shown by the formula (11) of the present invention is a compound having satisfactory light emission properties, and can be used, where necessary, in any of the embodiments shown in FIG. 1, FIG. 2 and FIG. 3. By way of illustration, the light emitting device of the invention can be formed, in the following manner: In the embodiment of FIG. 1, the organic compound (B-7) or (B-15) of the invention as a hole transporter, and the compound (18) indicated in Table 8 below as an electron transport luminant are mixed to form the light emitting layer 3. In the embodiment shown in FIG. 2, the organic compound (B-7) or (B-15) or its polymer is used as a hole transporter in the hole transport layer 5; and the compound (18) in Table 8 is employed as an electron transport luminant in the electron transport layer 6; and the light emitting layer 3a is composed of these two layers. In the embodiment shown in FIG. 3, the organic compound (B-7) or (B-15) or its polymer is used as a hole transporter in the hole transport layer 5; the compound (17) shown in Table 8 is employed as an electron transporter in the electron transport layer 6; and the compound (12) shown in Table 7 is employed as an luminant in the light emitting layer 3b.

In the light emitting device of the present invention the organic compound shown by the formula (1) or the polymer shown by the formula (11) can be used, as necessary, in combination with any of hole transport compounds investigated in the area of photoconductive substances for electrophotography or hole transport light emitting compounds already known (e.g., compounds shown in Table 7 below), or any of electron transport compounds or known electron transport light emitting compounds (e.g., compounds set forth in Table 8 below).

When the light emitting device is composed of plural layers interposed between a pair of electrodes, it is essential that at least one of these layers is composed of the organic compound or polymer defined in the present invention.
TABLE 7
Hole Transport Compounds
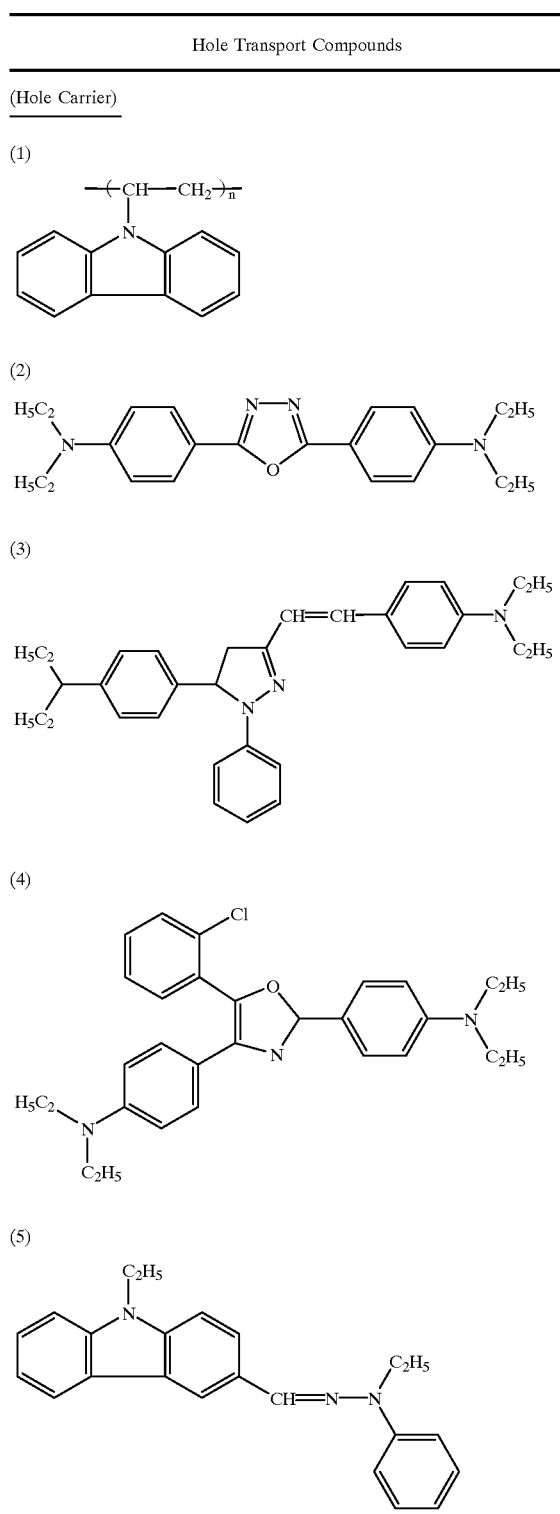
TABLE 7-continued
Hole Transport Compounds
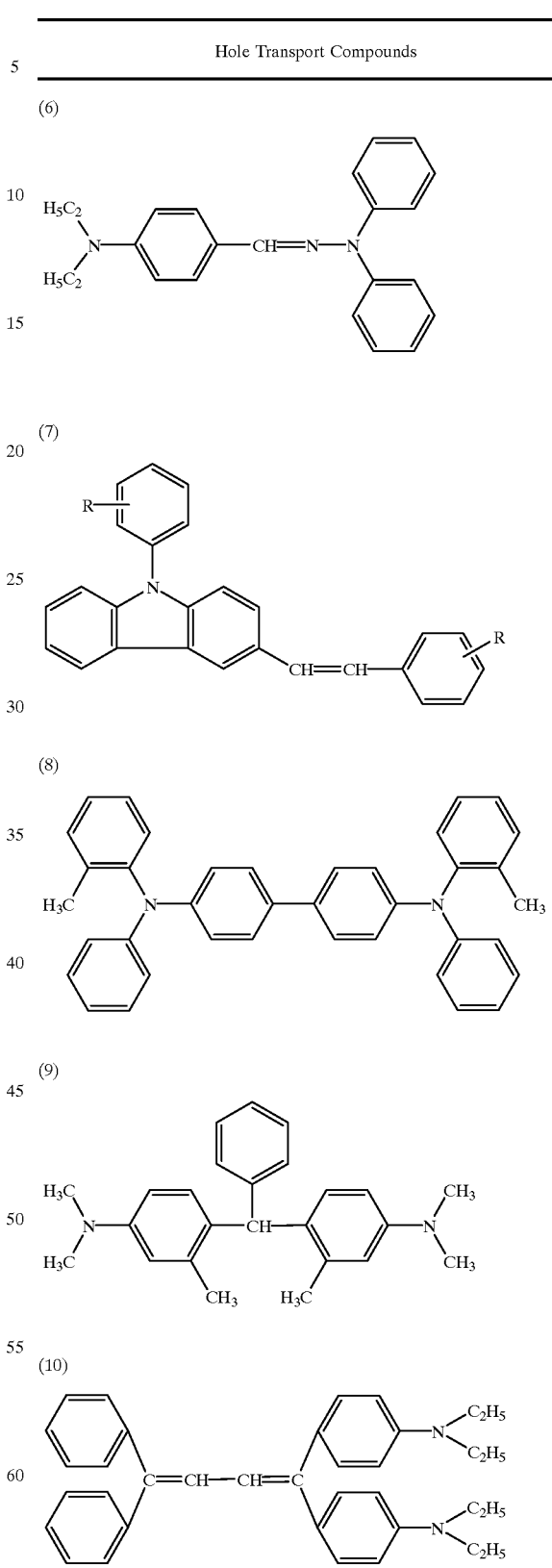

TABLE 7-continued

Hole Transport Compounds

(Hole Transport Luminant)

(11)

(12)

(13)

(14)

TABLE 8

Electron Transport Compounds

(Electron Carrier)

(15)

TABLE 8-continued

Electron Transport Compounds

(16)

(17)

(Electron Transport Luminant)

(18)

(19)

(20)

(21)

(22)

TABLE 8-continued

Electron Transport Compounds (23)

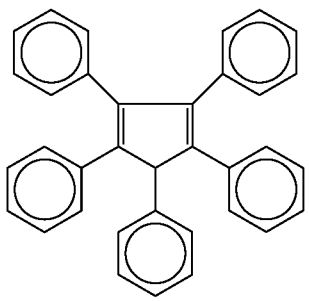

(24)

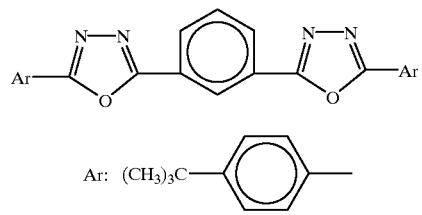

In the light emitting device of the present invention obtained with the use of the organic compound shown by the formula (1), the organic compound layer can be formed, for example, by vacuum deposition or solution coating in combination with a suitable binder to give a thin film.

In the present invention when the polymer of the formula (2) is employed, the organic compound layer can be obtained, for instance, by dip coating or spin coating process known as solution coating processes, or other processes to give a thin film.

The organic compound layer is preferably a thin film having a thickness of 2 μm or less, preferably 0.5 μm or less and more preferably 10 to 300 nm.

The binder as mentioned above can be selected from a wide variety of binding resins, and includes, but not limited to, polyvinylcarbazole resins, polycarbonate resins, polyester resins, polyarylate resins, butyral resins, polystyrene resins, poly(vinyl acetal) resins, diallyl phthalate resins, acrylic resins, methacrylic resins, phenol resins, epoxy resins, silicone resins, polysulfone resins, urea resins and others. Each of these resins can be used as a homo- or copolymer singly or in combination.

As the material for the anode, those having as large a work function as possible are desirable, including, for instance, nickel, gold, platinum, palladium, selenium, rhenium, iridium and alloys of these metals, or tin oxide, indium tin oxide (ITO), copper iodide and the like. Conductive polymers such as poly(3-methylthiophene), polyphenylene sulfide or polypyrrole can also be employed.

As the material for the cathode, any of those having a smaller work function are preferably employed, including silver, lead, tin, magnesium, aluminium, calcium, manganese, indium, chromium, or alloys of these substances.

At least one of the materials respectively used for the anode and cathode preferably transmits 50% or more of light in the emission wavelength region of the light emitting device.

Examples of the transparent substrate used in the present invention include those made of glass, plastic films and so on.

The present invention will now be described in more detail with reference to the following examples.

EXAMPLE 1

A synthetic example of the organic compound shown by the formula (1) of the present invention will be described below.

(Synthetic process of the exemplified compound No. (B-7))

To 100 ml of o-dichlorobenzene were added each 11.3 g (30.9 mmol) and 5.3 g (25.0 mmol) of the following compounds:

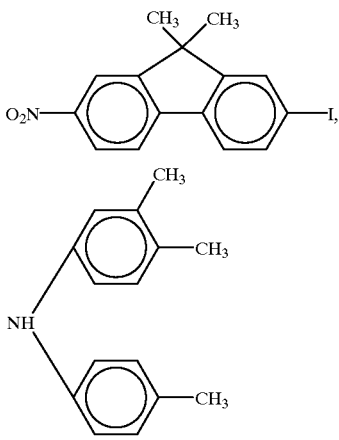

3.5 g (25.0 mmol) of anhydrous potassium carbonate and 3.2 g (50.0 mmol) of copper powder, and the resultant mixture was heated and refluxed with stirring for 8 hours. After cooling the reaction mixture, the mixture was subjected to suction filtration; and then the solvent was distilled off from the filtrate under reduced pressure. The residue was isolated and purified with silica gel chromatography to give 8.0 g of a coupled nitrated substance. Next, the nitrated substance was dissolved in 50 ml of ethanol. 0.5 g of activated carbon, 30 mg of ferric chloride hexahydrate and 1.9 g of hydrazine monohydrate were added and the mixture was refluxed. After completion of the reflux, the resultant mixture was allowed to stand and cool to thereby give 7.1 g of crystals of an amino product.

The amino product was then reacted with 12.0 g of the isocyanate shown by the following formula in dry benzene under $N_2$ gas atmosphere at a temperature below 5° C. After completion of the reaction, the solvent was distilled off under reduced pressure, and the residue was isolated and purified by silica gel chromatography, and then recrystallized to thereby give 6.5 g of the compound (B-7). The melting point of the compound was 203° C.

The synthetic reaction formula is shown below.

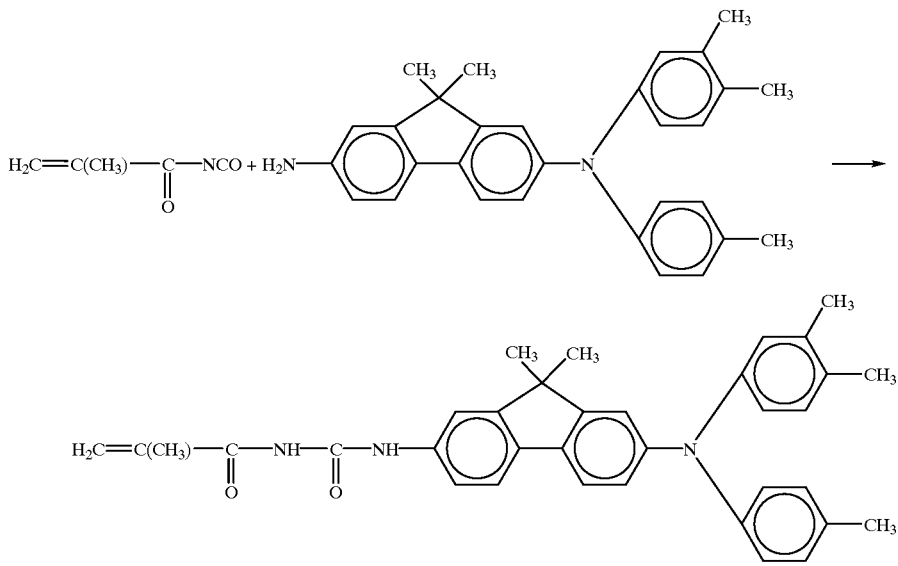

Other compounds can be obtained synthetically in the similar manner.

EXAMPLE 2

A synthetic example of the polymer represented by the formula (11) of the present invention will be described below.

To 25 ml of dry toluene, 2.0 g of the organic compound (B-7) obtained in Example 1 above and 30.0 mg of azobisisobutyronitrile were added, and the resultant mixture was subjected to polymerization reaction under nitrogen atmosphere at 60° C. for 24 hours. The reaction mixture was dissolved in chloroform and precipitated in methanol, and thereby a polymer of the organic compound (B-7) was obtained (hereinafter the polymer of the compound (B-7) may be referred to as "polymer BP-7"). As described above, the polymer of the formula (11) can be obtained by adding a polymerization initiator such as azo compounds or organic peroxides to the organic compound of the formula (1) and heating the resultant mixture in an inert gas. The polymer may also be obtained by heating the organic compound itself or irradiating the same with a ray having activating energy.

The physical properties of the polymer BP-7 are set forth below.

Tg: 96° C.

Molecular weight (GPC, solvent: THF)

Weight average molecular weight (Mw)/Number average molecular weight (Mn).

EXAMPLE 3

Onto a transparent anode of indium tin oxide (ITO) film (50 nm in film thickness) formed on a glass substrate, a hole transport layer (50 nm in thickness) composed of the compound (B-7) indicated in Table 2, an electron transport light emitting layer (50 nm in thickness) composed of the compound (18) shown in Table 8, and a cathode (500 nm in thickness) composed of a Mg/Ag alloy (10:1 by weight) were formed in this order by vacuum deposition, and thereby a light emitting device as illustrated in FIG. 2 was prepared.

The anode and cathode of the device thus obtained were connected each other via an electric lead and a direct current source, and then a voltage of 7 V was applied to the device. As a result, an electric current with a current density of 3.2 mA/cm² flowed through the device and a light emission of 1,800 cd/m² was observed.

The same current density (3.2 mA/cm²) was then maintained for 100 hours, and as a result, a light emission of 970 cd/m² could be obtained at an applied voltage of 7.5 V even after a 100 hour application.

EXAMPLES 4 TO 7

Light emitting devices were respectively prepared in the same manner as Example 3, except each of the compounds indicated in the following Table 9 was employed instead of the compound (B-7) used in Example 3.

An electric current with a current density of 3.2 mA/cm² was then applied to each of the obtained devices for 100 hours. The results are shown in Table 9 below.

TABLE 9

| | | Initial | | After 100 hr | |
|---|---|---|---|---|---|
| Example | Compound | Applied Voltage (V) | Emission (cd/m²) | Applied Voltage (V) | Emission (cd/m²) |
| 4 | A-7 | 7.4 | 1930 | 7.8 | 1050 |
| 5 | A-1 | 7.1 | 1680 | 8.1 | 980 |
| 6 | B-15 | 7.3 | 2020 | 8.3 | 1130 |
| 7 | B-22 | 6.9 | 2100 | 7.9 | 1200 |

EXAMPLE 8

Onto a transparent anode composed of indium tin oxide (ITO) film (50 nm in film thickness) formed on a glass substrate, a hole transport layer (50 nm in thickness) was formed by spin-coating a chloroform solution of the polymer BP-7 obtained in Example 2. Then, upon the hole transport layer, were formed (i) an electron transport light emitting layer composed of the compound (18) indicated in Table 8 and (ii) a cathode (500 nm in thickness) composed of a Mg/Ag alloy (10:1 by weight) respectively in this order by vacuum deposition. A light emitting device as shown in FIG. 2 was thus obtained.

The anode and cathode of the device thus obtained were connected each other via an electric lead and a direct current source, and then a voltage of 10 V was applied to the device. As a result, an electric current with a current density of 39 mA/cm² flowed through the device and a light emission of 2,200 cd/m² was observed.

The same current density (39 mA/cm²) was maintained for 100 hours, and as a result, a light emission of 1,400 cd/m² could be obtained at an applied voltage of 11 V even after a 100 hour application.

EXAMPLES 9 TO 12

Light emitting devices were respectively prepared in the same manner as Example 8, except each of the compounds indicated in the following Table 10 was employed instead of the polymer (BP-7) used in Example 8.

An electric current at a current density of 39 mA/cm² was then applied to each of the obtained devices for 100 hours. The test results are shown in Table 10 below.

TABLE 10

| Example | Compound | Initial | | After 100 hr | | Polymer |
|---|---|---|---|---|---|---|
| | | Applied Voltage (V) | Emission (cd/m²) | Applied Voltage (V) | Emission (cd/m²) | |
| 9 | A-1 | 10.3 | 1630 | 11.6 | 870 | AP-1 |
| 10 | A-7 | 10.1 | 2050 | 11.3 | 1200 | AP-7 |
| 11 | B-15 | 10.6 | 1860 | 11.8 | 1070 | BP-15 |
| 12 | B-22 | 9.8 | 2270 | 10.9 | 1290 | BP-22 |

Note

Molecular weight of Polymer AP-1 (Mw/Mn)=13200/8300=1.6

Molecular weight of Polymer AP-7 (Mw/Mn)=14600/9100=1.6

Molecular weight of Polymer BP-15 (Mw/Mn)=13400/7800=1.7

Molecular weight of Polymer BP-22 (Mw/Mn)=11000/6900=1.6

EXAMPLE 13

Onto a glass substrate were formed an anode (50 nm in thickness) composed of gold; and a hole transport layer (40 nm in thickness) obtained by spin-coating a chloroform solution of Polymer (BP-7) used in Example 8. An electron transport light emitting layer (60 nm in thickness) composed of the compound (24) indicated in Table 8, and a cathode (300 nm in thickness) made of aluminum were respectively formed in this order by vacuum deposition onto the hole transport layer to thereby give a light emitting device as illustrated in FIG. 2.

The anode and cathode of the device thus obtained were connected each other via an electric lead and a direct current source, and then a voltage of 10 V was applied to the device. As a result, an electric current at a current density of 47 mA/cm² flowed through the device and a light emission of 530 cd/m² was observed.

What is claimed is:

1. An organic compound represented by the following formula (1):

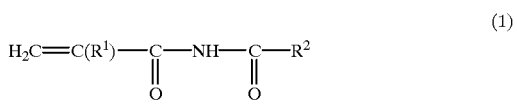

wherein $R^1$ is a hydrogen atom, an alkyl group or a halogen atom, and $R^2$ is X—$Ar^1$; X is NH, O or S, and $Ar^1$ is a substituted or unsubstituted aromatic ring having a partial structure represented by the following formula (2):

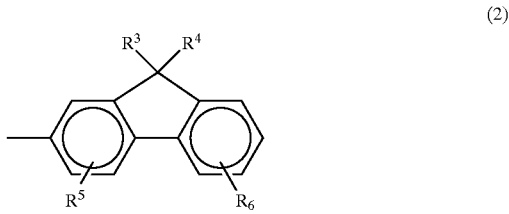

or a substituted or unsubstituted heterocyclic ring; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring.

2. The organic compound as claimed in claim 1, wherein the substituent $R^2$ has a structure selected from the group consisting of the following formulas (3)–(6):

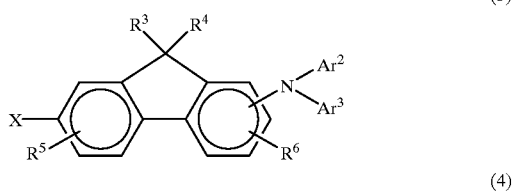

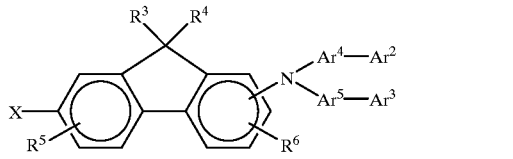

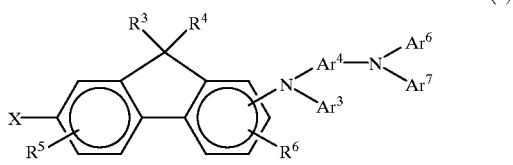

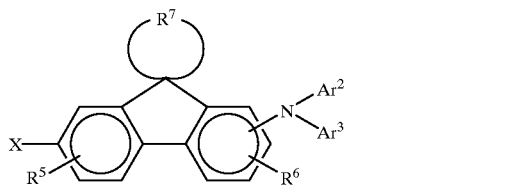

wherein X is NH, O or S; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring; $R^7$ is an alkylene group having from 2 to 10 carbon atoms; and each of $Ar^2$, $Ar^3$, $Ar^4$, $Ar^5$, $Ar^6$ and $Ar^7$ is a substituted or unsubstituted aromatic ring, or a substituted or unsubstituted heterocyclic ring.

3. The organic compound as claimed in either of claim 1 or 2, wherein the substituent $R^2$ has a structure selected from the group consisting of the following formulas (7)–(10):

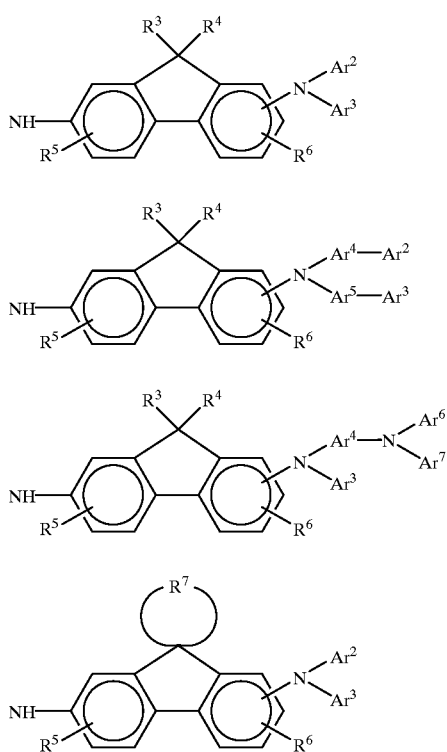

wherein $R^3$, $R^4$, $R^5$, $R^6$, $R^7$, $Ar^2$, $Ar^3$, $Ar^4$, $Ar^5$, $Ar^6$ and $Ar^7$ have the same meanings as defined above.

4. A polymer represented by the following formula (11):

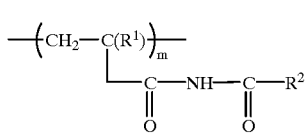

wherein $R^1$ is a hydrogen atom, an alkyl group or a halogen atom, and $R^2$ is X—$Ar^1$; X is NH, O or S, and $Ar^1$ is a substituted or unsubstituted aromatic ring having a partial structure as set forth in formula (2):

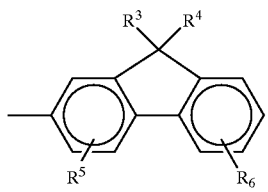

or a substituted or unsubstituted heterocyclic ring; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring; and m is an integer of from 2 to 3,000.

5. The polymer as claimed in claim 4, wherein the substituent $R^2$ has a structure selected from the group consisting of the following formulas (3)–(6):

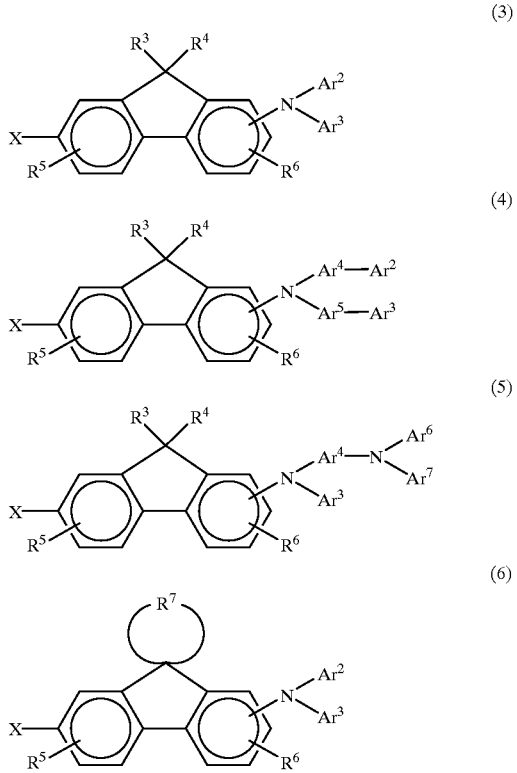

wherein X is NH, O or S; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring; $R^7$ is an alkylene group having from 2 to 10 carbon atoms; and each of $Ar^2$, $Ar^3$, $Ar^4$, $Ar^5$, $Ar^6$ and $Ar^7$ is a substituted or unsubstituted aromatic ring, or a substituted or unsubstituted heterocyclic ring.

6. The polymer as claimed in either of claim 4 or 5, wherein the substituent $R^2$ has a structure selected from the group consisting of the following formulas (7)–(10):

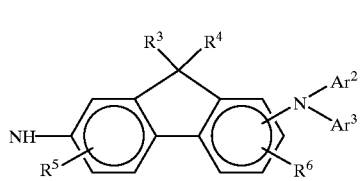

-continued (8)

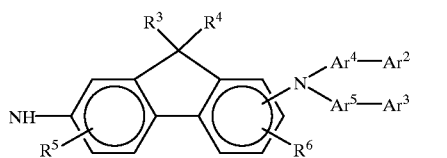

(9)

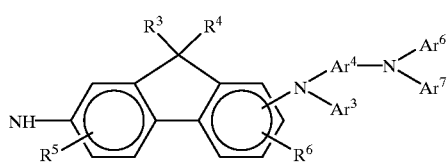

(10)

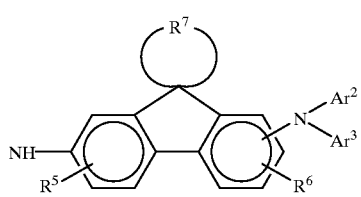

wherein $R^3$, $R^4$, $R^5$, $R^6$, $R^7$, $Ar^2$, $Ar^3$, $Ar^4$, $Ar^5$, $Ar^6$ and $Ar^7$ have the same meanings as defined above.

7. A light emitting device composed of a pair of electrodes and an organic compound layer interposed between the electrodes, wherein an organic compound represented by the following formula (1) is used to form said organic compound layer:

(1)

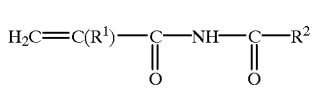

wherein $R^1$ is a hydrogen atom, an alkyl group or a halogen atom, and $R^2$ is $X$—$Ar^1$; X is NH, O or S, and $Ar^1$ is a substituted or unsubstituted aromatic ring having a partial structure as in the following formula (2):

(2)

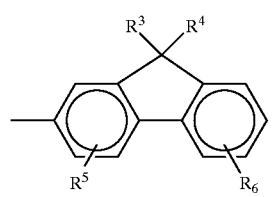

or a substituted or unsubstituted heterocyclic ring; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring.

8. The light emitting device as claimed in claim 7, wherein the substituent $R^2$ has a structure selected from the group consisting of the following formulas (3)–(6):

(3)

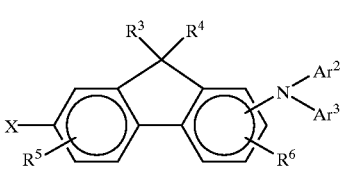

(4)

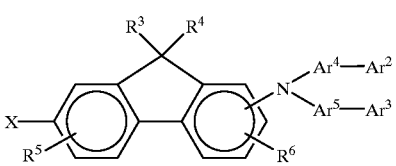

(5)

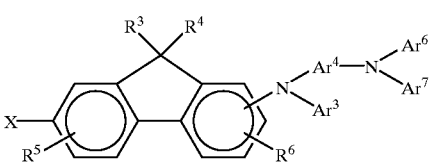

(6)

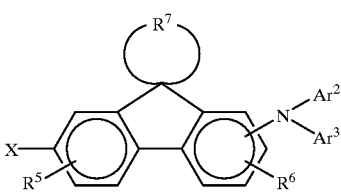

wherein X is NH, O or S; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring; $R^7$ is an alkylene group having from 2 to 10 carbon atoms; and each of $Ar^2$, $Ar^3$, $Ar^4$, $Ar^5$, $Ar^6$ and $Ar^7$ is a substituted or unsubstituted aromatic ring, or a substituted or unsubstituted heterocyclic ring.

9. The light emitting device as claimed in either of claim 7 or 8, wherein the substituent $R^2$ has a structure selected from the group consisting of the following formulas (7)–(10):

(7)

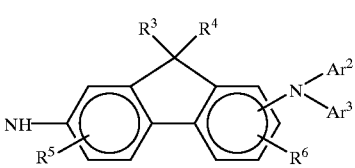

-continued

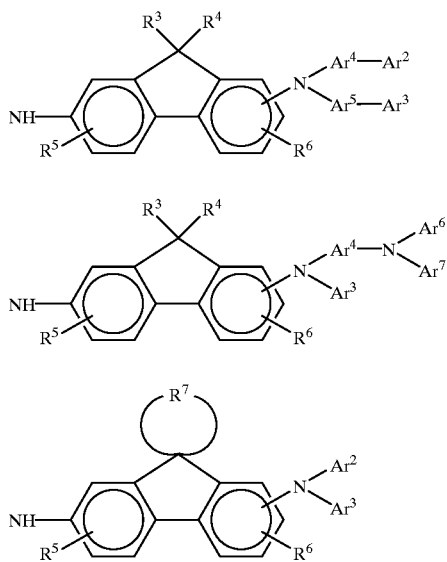
(8)

(9)

(10)

wherein $R^3$, $R^4$, $R^5$, $R^6$, $R^7$, $Ar^2$, $Ar^3$, $Ar^4$, $Ar^5$, $Ar^6$ and $Ar^7$ have the same meanings as defined above.

10. A light emitting device composed of a pair of electrodes and an organic compound layer interposed between the electrodes, wherein a polymer represented by the following formula (11) is used to form said organic compound layer:

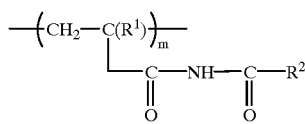
(11)

wherein $R^1$ is a hydrogen atom, an alkyl group or a halogen atom, and $R^2$ is X—$Ar^1$; X is NH, O or S, and $Ar^1$ is a substituted or unsubstituted aromatic ring having a partial structure shown in formula (2):

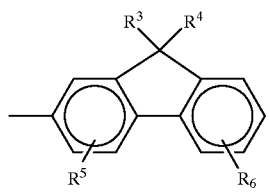
(2)

or a substituted or unsubstituted heterocyclic ring; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring; and m is an integer of from 2 to 3,000.

11. The light emitting device as claimed in claim 10, wherein the substituent $R^2$ has a structure selected from the group consisting of the following formulas (3)–(6):

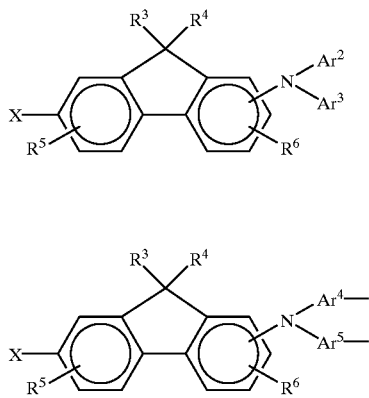
(3)

(4)

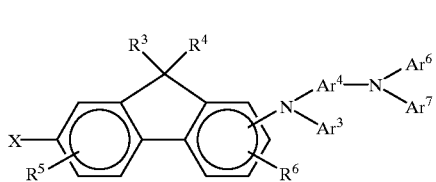
(5)

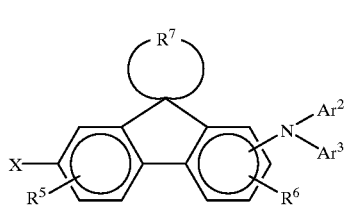
(6)

wherein X is NH, O or S; each of $R^3$ and $R^4$ is a hydrogen atom, an alkyl group, a substituted or unsubstituted aromatic ring, or a substituted or unsubstituted heterocyclic ring; each of $R^5$ and $R^6$ is a hydrogen atom, a halogen atom, an alkyl group, an aralkyl group, an alkoxy group, a substituted or unsubstituted aromatic ring, or a substituted or unsubstituted heterocyclic ring; $R^7$ is an alkylene group having from 2 to 10 carbon atoms; and each of $Ar^2$, $Ar^3$, $Ar^4$, $Ar^5$, $Ar^6$ and $Ar^7$ is a substituted or unsubstituted aromatic ring, or a substituted or unsubstituted heterocyclic ring.

12. The light emitting device as claimed in either of claim 10 or 11, wherein the substituent $R^2$ has a structure selected from the group consisting of the following formulas (7)–(10):

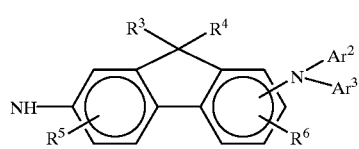
(7)

-continued
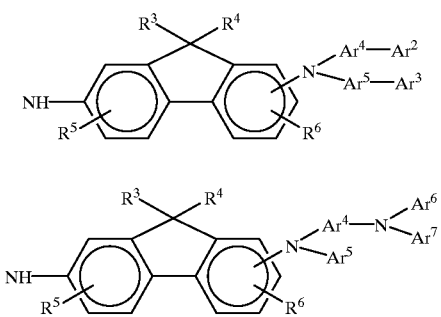
(8)
(9)
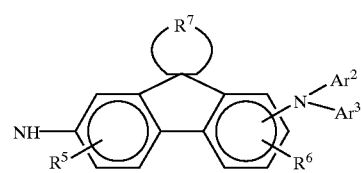
(10)
wherein $R^3$, $R^4$, $R^5$, $R^6$, $R^7$, $Ar^2$, $Ar^3$, $Ar^4$, $Ar^5$, $Ar^6$ and $Ar^7$ have the same meanings as defined above.
* * * * *

UNITED STATES PATENT AND TRADEMARK OFFICE
CERTIFICATE OF CORRECTION

PATENT NO.    : 6,017,644
DATED         : January 25, 2000
INVENTOR(S)   : Yomishi Toshida et al.

It is certified that error appears in the above-identified patent and that said Letters Patent is hereby corrected as shown below:

Title page,
Item [56], References Cited,
Under FOREIGN PATENT DOCUMENTS:
"194393" should read -- 59-194393 --;
"264692" should read -- 63-264692 --; and
"163188" should read -- 3-163188 --; and
Under OTHER PUBLICATIONS:
After "Schwob, et al.,;" "antracene" should read -- Anthracene --.
Item [57], ABSTRACT, LINE 3, "a" should read -- an --.

Column 1,
Line 60, "(Proceedings," should read -- (Proceedings --.

Column 2,
Line 3, "have" should read -- has --.

Column 21,
Line 43, "but" should read -- but is --.

Column 23,
Line 53, "(Mn)" should read -- (Mn) = 15300/7500 = 2.0 --; and
Line 66, "each" should read -- to each --.

Column 25,
Line 2, "each" should read -- to each --;
Line 53, "(24)indicated" should read -- (24) indicated --;
Line 59, "each" should read -- to each --.

Signed and Sealed this

Twentieth Day of November, 2001

*Attest:*

*Nicholas P. Godici*

NICHOLAS P. GODICI
*Attesting Officer*    *Acting Director of the United States Patent and Trademark Office*